(12) United States Patent
Son et al.

(10) Patent No.: US 10,008,658 B2
(45) Date of Patent: Jun. 26, 2018

(54) VIBRATOR

(71) Applicant: SAMSUNG ELECTRO-MECHANICS CO., LTD., Suwon-Si (KR)

(72) Inventors: Yeon Ho Son, Suwon-Si (KR); Seung Hyeon Jeong, Suwon-Si (KR); Joon Choi, Suwon-Si (KR); Kyung Su Park, Suwon-si (KR); Sang Jin Lee, Suwon-Si (KR); Jae Kyung Kim, Suwon-Si (KR); Dong Su Moon, Suwon-Si (KR)

(73) Assignee: MPLUS CO., LTD., Suwon-si, Gyeonggi-Do (KR)

( * ) Notice: Subject to any disclaimer, the term of this patent is extended or adjusted under 35 U.S.C. 154(b) by 626 days.

(21) Appl. No.: 14/626,895

(22) Filed: Feb. 19, 2015

(65) Prior Publication Data

US 2015/0318463 A1 Nov. 5, 2015

(30) Foreign Application Priority Data

May 2, 2014 (KR) ........................ 10-2014-0053378

(51) Int. Cl.
*H01L 41/04* (2006.01)
*H01L 41/09* (2006.01)
*H01L 41/053* (2006.01)

(52) U.S. Cl.
CPC ........ *H01L 41/0933* (2013.01); *H01L 41/053* (2013.01)

(58) Field of Classification Search
CPC .................. H01L 41/0933; H01L 41/053

USPC .......................................................... 310/346
See application file for complete search history.

(56) References Cited

U.S. PATENT DOCUMENTS

| 3,751,692 A * | 8/1973 | Choffat ................... H03H 9/09 |
| | | 310/344 |
| 6,205,226 B1 * | 3/2001 | Senoo ..................... H04R 17/00 |
| | | 310/311 |
| 2004/0155560 A1 * | 8/2004 | Koike ................. G01C 19/5663 |
| | | 310/348 |
| 2005/0023937 A1 * | 2/2005 | Sashida ................. B06B 1/0611 |
| | | 310/348 |

(Continued)

FOREIGN PATENT DOCUMENTS

| CN | 1304555 A | 7/2001 |
| CN | 104183694 A | 5/2013 |

(Continued)

OTHER PUBLICATIONS

SIPO Office Action for Chinese Patent Application No. 201510106434.4, dated Sep. 20, 2017, which corresponds to the above-referenced U.S. application.

(Continued)

*Primary Examiner* — J. San Martin
(74) *Attorney, Agent, or Firm* — LRK Patent Law Firm

(57) ABSTRACT

A vibrator includes: a housing having an interior space; a vibrating member installed within the housing; a piezoelectric element installed on a top surface of the vibrating member; and space forming parts disposed to face side surfaces of the piezoelectric element, respectively, and forming a space in which a filler is provided, together with the side surfaces of the piezoelectric element.

11 Claims, 5 Drawing Sheets

(56) References Cited

U.S. PATENT DOCUMENTS

| | | | |
|---|---|---|---|
| 2006/0244344 A1* | 11/2006 | Tanaka | H03B 5/36 |
| | | | 310/344 |
| 2009/0015099 A1 | 1/2009 | Mukae | |
| 2013/0093577 A1* | 4/2013 | Park | G06F 3/0416 |
| | | | 340/407.1 |
| 2013/0106239 A1* | 5/2013 | Yun | G06F 3/016 |
| | | | 310/300 |
| 2015/0318462 A1* | 11/2015 | Kim | G06F 3/016 |
| | | | 310/332 |

FOREIGN PATENT DOCUMENTS

| | | |
|---|---|---|
| CN | 104056769 A | 9/2014 |
| JP | 2006211065 A | 8/2006 |
| JP | 3844012 B2 | 11/2006 |
| JP | 2009-22103 A | 1/2009 |
| JP | 2010103977 A | 5/2010 |
| KR | 10-2008-0090618 A | 10/2008 |
| KR | 10-2011-0045486 A | 5/2011 |
| KR | 10-1157868 B1 | 6/2012 |
| KR | 10-2012-0105785 A | 9/2012 |
| KR | 1020130078250 A | 7/2013 |

OTHER PUBLICATIONS

SIPO Office Action for Chinese Patent Application No. 201510106434.4 dated Mar. 23, 2017 which corresponds to the above referenced U.S. application.

KIPO Office Action for Korean Patent Application No. 10-2014-0053378 which corresponds to the above-referenced U.S. application.

KIPO Final Office Action for Korean Patent Application No. 10-2014-0053378 which corresponds to the above-referenced U.S. application.

KIPO Notice of Allowance for Korean Patent Application No. 10-2014-0053378 which corresponds to the above-referenced U.S. application.

\* cited by examiner

B - B'

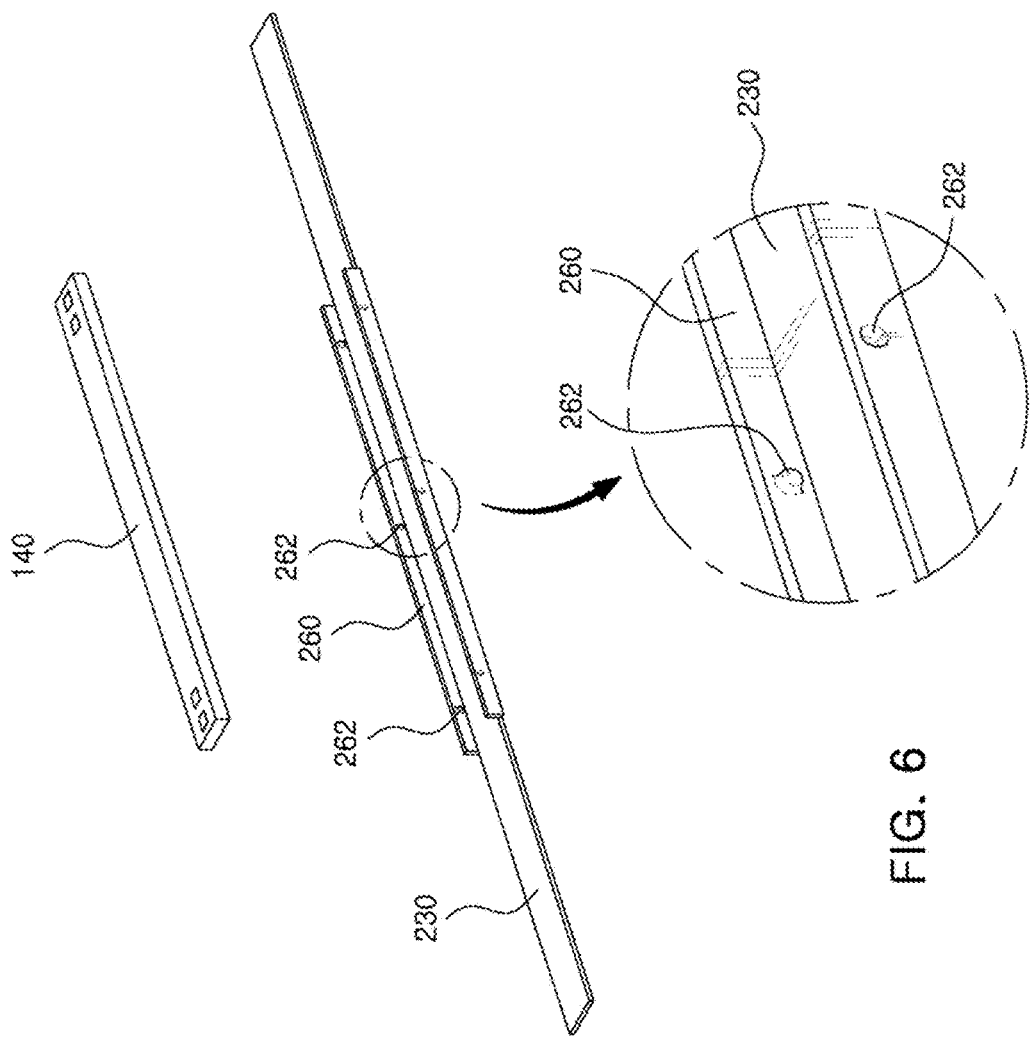

VIBRATOR

CROSS REFERENCE TO RELATED APPLICATION

This application claims the priority and benefit of Korean Patent Application No. 10-2014-0053378 filed on May 2, 2014, with the Korean Intellectual Property Office, the disclosure of which is incorporated herein by reference.

BACKGROUND

1. Field of the Invention

The present disclosure relates to a vibrator.

2. Description of Related Art

A vibrator has recently been developed which uses a piezoelectric element having a high response speed and being driven at various frequencies as compared to an existing vibrator using eccentric weights.

In the above-mentioned vibrator, a multilayer piezoelectric element is generally used. However, when the piezoelectric element falls or is impacted by external force, the piezoelectric element may easily crack due to characteristics of the piezoelectric element.

In this case, the amount of vibration may be significantly reduced.

Accordingly, there is a need for a piezoelectric element with a structure capable of suppressing the reduction of the amount of vibration even when the piezoelectric element cracks.

RELATED ART DOCUMENT

Korean Patent Laid-Open Publication No. 2008-0090618

SUMMARY

The present invention provides a vibrator capable of suppressing a reduction in the amount of vibration even when a piezoelectric, element is damaged.

According to an aspect of the present disclosure, a vibrator may include: a housing having an interior space; a vibrating member installed within the housing; a piezoelectric element installed on a top surface of the vibrating member; and space forming parts disposed to face side surfaces of the piezoelectric element, respectively, and forming a space in which a filler is provided, together with the side surfaces of the piezoelectric element.

BRIEF DESCRIPTION OF THE DRAWINGS

The above and other aspects, features and other advantages of the present disclosure will be more clearly understood from the following detailed description taken in conjunction with the accompanying drawings, in which:

FIG. 6 is a perspective view illustrating a modified exemplary embodiment of a vibrating member.

DETAILED DESCRIPTION

Figure 1:
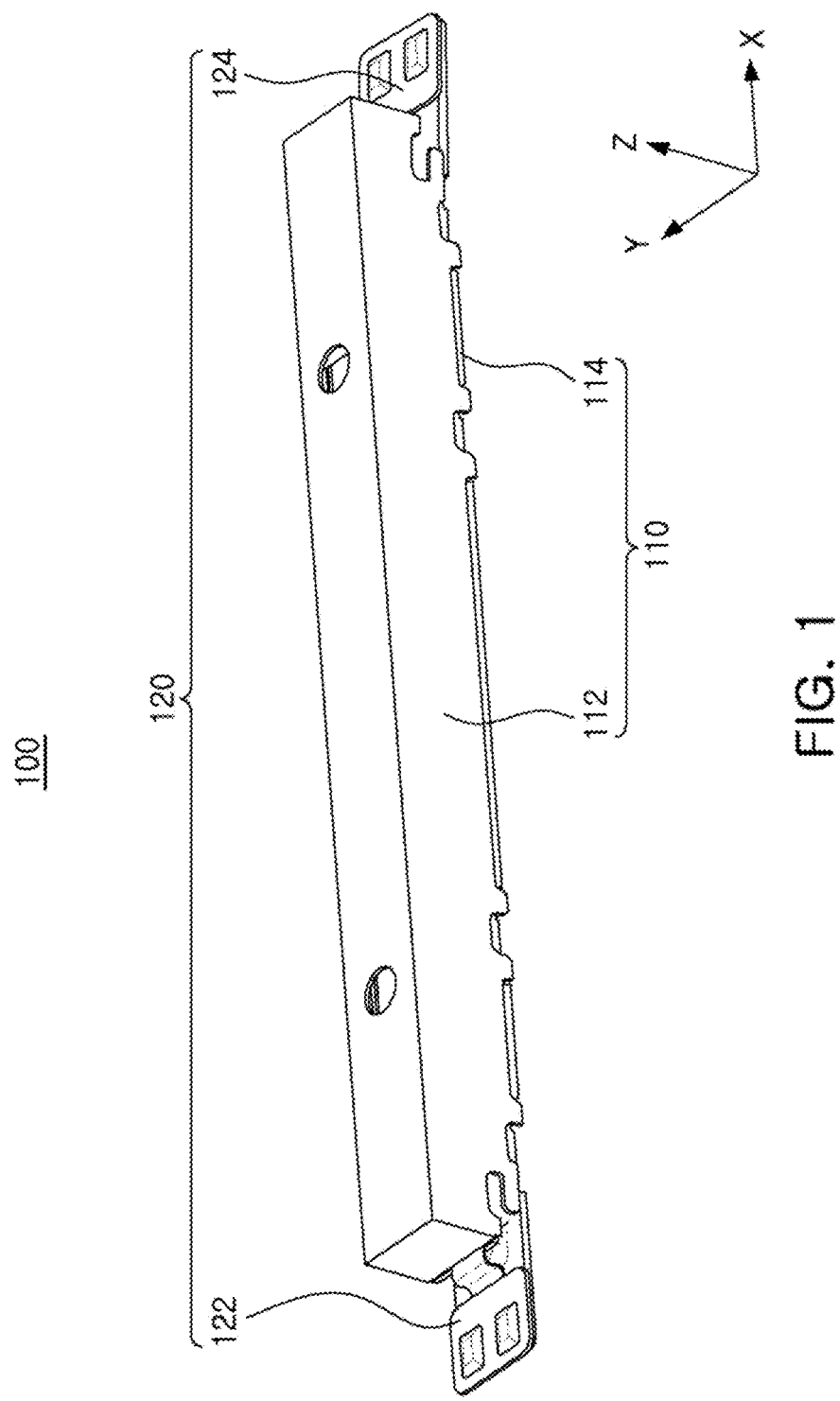
FIG. 1 is a perspective view illustrating a vibrator according to an exemplary embodiment in the present disclosure.

Hereinafter, embodiments in the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements maybe exaggerated for clarity, and the same reference numerals will be used throughout to designate the same or like elements.

FIG. 1 is a perspective view illustrating a vibrator according to an exemplary embodiment in the present disclosure.

Referring to FIG. 1, a vibrator 100 may include a housing 110 having a shape of parallelepiped. The housing 110 may include an upper case 112 having an interior space and a bracket 114 which is coupled to a lower end portion of the upper case 112.

Meanwhile, end portions of a circuit board 120 may be led out from an interior of the housing 110 to an exterior thereof. In addition, the circuit board 120 may include a main circuit board 122, which is led out from one end of the housing 110, and a preliminary circuit board 124, which is led out from the other end of the housing 110. A detailed description thereof will be provided.

Hereinafter, a configuration of the vibrator 100 will be described in greater detail.

Figure 2:
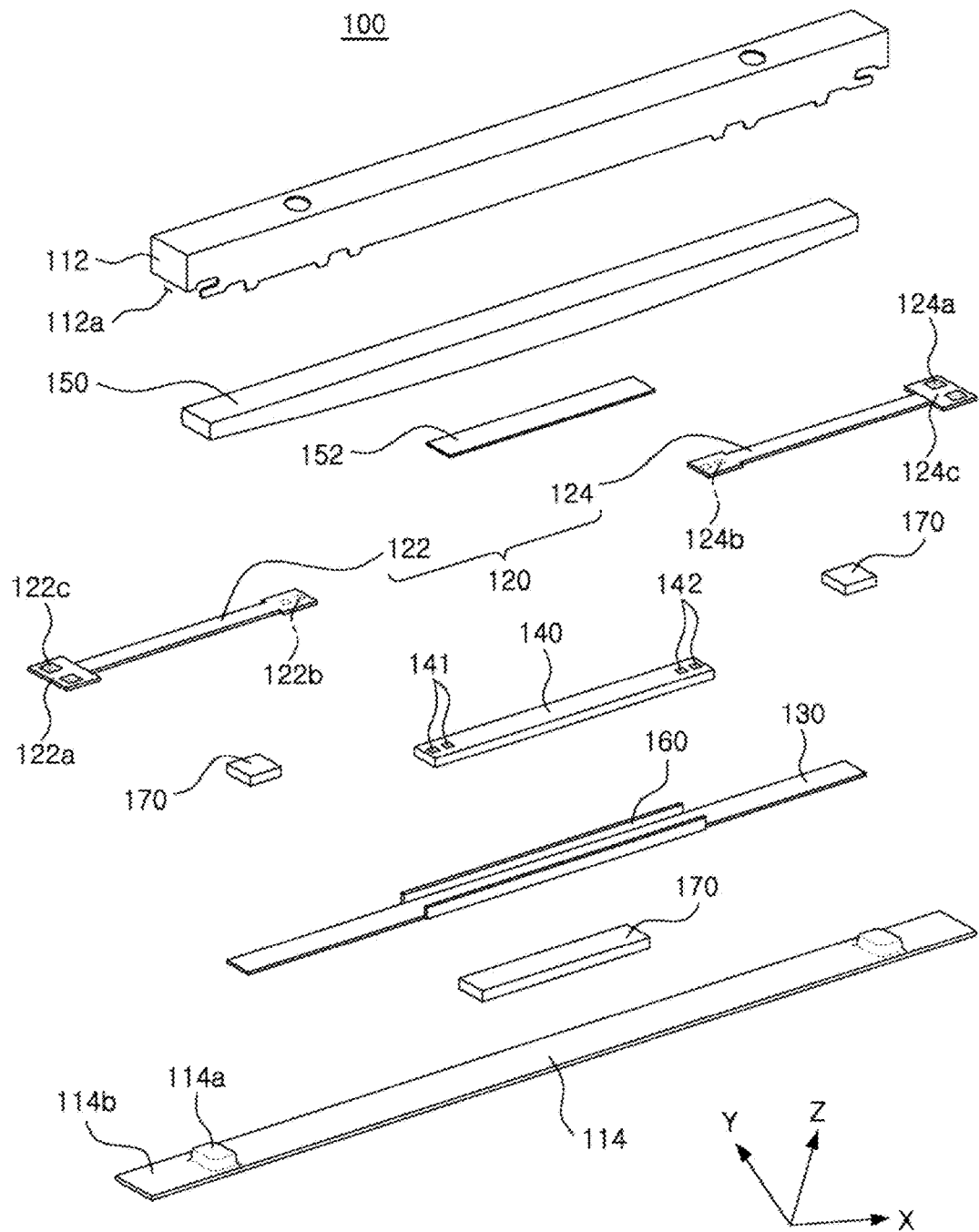
FIG. 2 is an exploded perspective view illustrating a vibrator according to an exemplary embodiment in the present disclosure.

FIG. 2 is an exploded perspective view illustrating a vibrator according to an exemplary embodiment in the present disclosure.

Referring to FIG. 2, the vibrator 100 may include the housing 110, the circuit board 120, a vibrating member 130, and a piezoelectric element 140.

The housing 110 may have an interior space and may include the upper case 112 and the bracket 114.

The upper case 112 may have a box shape having an open lower portion. That is, the upper case 112 may have a shape of parallelepiped having an interior space. Meanwhile, the bracket 114 may be coupled to the lower end portion of the upper case 112.

Meanwhile, the upper case 112 may be provided with a lead groove 112a so that one end portion of the circuit board 120 may be led out from the housing 110. That is, one end portion of the circuit board 120 may be led out from the interior of the housing 110 through the lead groove 112a even when the upper case 112 and the bracket 114 are coupled.

The bracket 114 may have a plate shape and may include support parts 114a formed at both end portions thereof to support the vibrating member 130. The support part 114a may be formed to protrude from the bracket 114.

Meanwhile, the bracket 114 may be formed to have a length greater than that of the upper case 112. That is, the bracket 114 may have the length greater than that of the upper case 112 so that one end portion of the circuit board 120 which is led out to the exterior of the bracket 114 may be seated thereon. In other words, the bracket 114 may be provided with a seating part 114b on which one end portion of the circuit board 120 is seated.

The circuit board 120 may be connected to the piezoelectric element 140 and may include the main circuit board 122 and the preliminary circuit board 124. One end portion of the main circuit board 122 may be led out from one end portion of the housing 110, and one end portion of the preliminary circuit board 124 may be led out from the other end portion of the housing 110.

Meanwhile, the main circuit board 122 and the preliminary circuit board 124 have substantially the same configuration except for the installation position. Therefore, only the main circuit board 122 will be described and a description of the preliminary circuit board 124 will be omitted.

As described above, one end portion of the main circuit board 122 which is fixedly installed on the seating part 114b of the bracket 114 may be provided with an electrode connecting part 122a, and the other end of the main circuit board 122 may be provided with a connecting electrode 122b for an electrical connection to the piezoelectric element 140.

In, addition, the electrode connecting part 122a may be provided with an external connecting electrode 122c for a connection to an external power source.

Reference numerals 124a, 124b, and 124c denote the electrode connecting part, the connecting electrode, and the external connecting electrode, respectively, which are included in the preliminary circuit board 124.

The vibrating member 130 may be installed within the housing 110. That is, the vibrating member 130 may have both end portions which are bonded to, the support parts 114a of the bracket 114 to thereby be fixedly installed within the housing 110. However, although the vibrating member 130 is fixedly installed on the bracket 114 in the present embodiment, the installation position of the vibrating member 130 is not limited thereto. For example, the vibrating member 130 may also be installed in the upper case 112.

Meanwhile, the vibrating member 130 may have a plate shape and may have a central portion which is vertically vibrated in a case in which the piezoelectric element 140 is deformed. In other words, the vibrating member 130 may be vibrated in a thickness direction.

Figure 4:
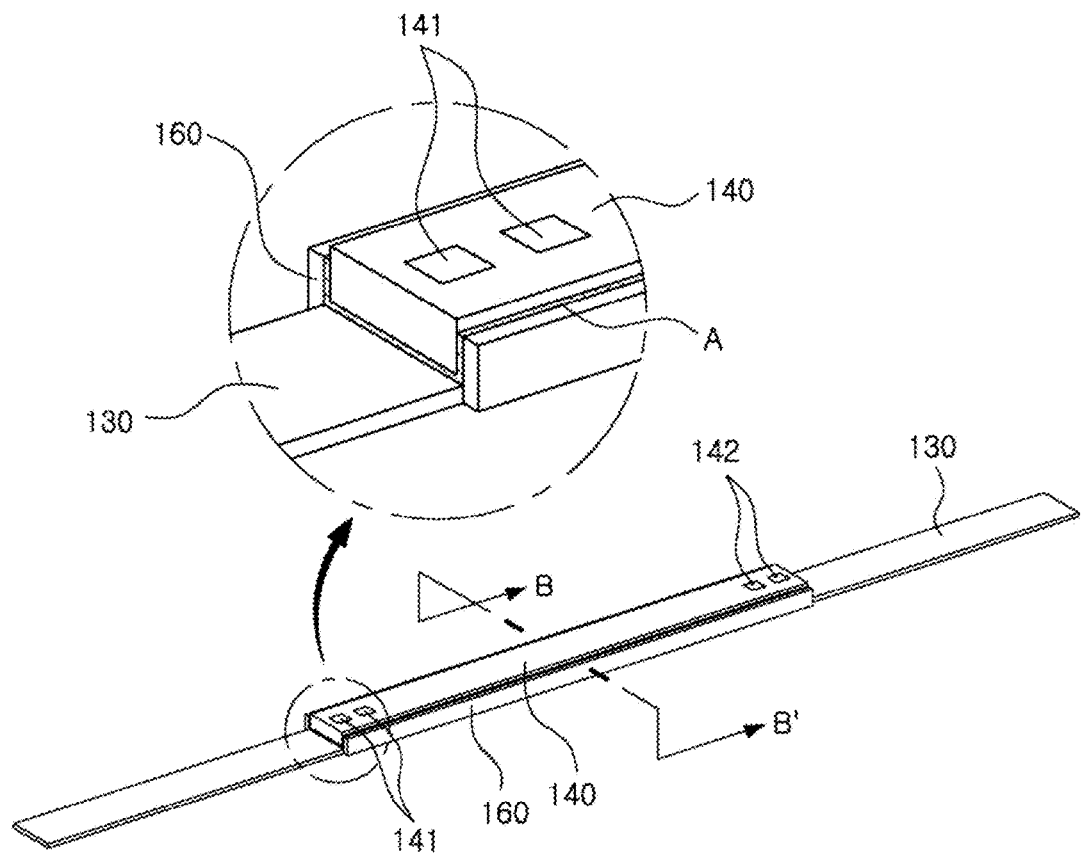
FIG. 4 is a perspective view illustrating a vibrating member and a piezoelectric element included in a vibrator according to an exemplary embodiment in the present disclosure.

The vibrating member 130 may be provided with space forming parts 160 which are disposed to face side surfaces of the piezoelectric element 140, respectively, and form a space in which a filler A is provided as illustrated in FIG. 4, together with the side surfaces of the piezoelectric element 140.

As illustrated in FIGS. 1 and 2, a length direction refers to X direction, a width direction refers to Y direction, and a thickness direction refers to Z direction.

The vibrating member 130 and the piezoelectric element 140 may each have a plate shape of parallelepiped. As a result, the vibrating member 130 and the piezoelectric element 140 may each have a total of six surfaces. That is, the vibrating member 130 and the piezoelectric element 140 may each have a top surface, a bottom surface, and four surfaces connecting the top surface and the bottom surface to each other. Among the four surfaces, two surfaces having relatively large areas refer to the side surfaces, and the other two surfaces having areas smaller than those of the side surfaces refer to the end portion surfaces. Hereinafter, outer surfaces of the vibrating member 130 and the piezoelectric element 140 will be described using the above-mentioned terms.

The above-mentioned space forming parts 160 may be formed to be extended from both side surfaces of the vibrating member 130 in the thickness direction thereof. That is, the space forming parts 160 may be formed as ribs formed to be extended from both side surfaces of the vibrating member 130. In addition, in the case in which the piezoelectric element 140 is installed on the vibrating member 130, the space forming parts 160 may serve to form a predetermined space, together with the piezoelectric element 140.

Meanwhile, a ratio of a height of the space forming part 160 to a thickness of the piezoelectric element 140 may be 0.5:1 to 1:1. That is, in a case in which the height of the space forming part 160 is less than half of the thickness of the piezoelectric element 140, the filler A may not be sufficiently provided, and in a case in which the height of the space forming part 160 is greater than the thickness of the piezoelectric element 140, the filler A may be provided to an excessive extent, and as a result, the filler may be coated on the top surface of the piezoelectric element 140. Accordingly, the height of the space forming part 160 may be formed to be greater than half of the thickness of the piezoelectric element 140 and to be less than the thickness of the piezoelectric element 140.

The piezoelectric element 140 may be installed on the vibrating member 130. That is, the piezoelectric element 140 may be installed on the top surface of the vibrating member 130. Meanwhile, in the case in which the piezoelectric element 140 is installed on the vibrating member 130, the piezoelectric element 140 may be installed so that both side surfaces thereof are disposed to be spaced apart from inner surfaces of the space forming parts 160 of the vibrating member 130 at predetermined intervals, respectively.

In addition, the piezoelectric element 140 may be fixedly installed on the vibrating member 130 using the filler A, wherein the filler A may be an adhesive by way of example. In other words, once the adhesive is applied onto the top surface of the vibrating member 130 and the piezoelectric element 140 is then seated on the top surface of the vibrating member 130, the adhesive may be filled into the space formed by the space forming parts 160 and both side surfaces of the piezoelectric element 140. As such, the filler A, that is, the adhesive, may bond the vibrating member 130 onto the bottom surface of the piezoelectric element 140 and both side surfaces of the piezoelectric element 140.

A detailed description thereof will be provided.

Meanwhile, the piezoelectric element 140 may include the main electrode 141 formed by an electrode pair and at least one preliminary electrode 142 formed by an electrode pair and disposed to be spaced apart from the main electrode 141.

In addition, the piezoelectric element 140 may be deformed even in a case in which only one of the main electrode 141 and the preliminary electrode 142 is connected to the external power source.

A more detailed description thereof will be provided.

Meanwhile, the vibrator 100 may further include a weighting body 150.

The weighting body 150 may be disposed on an upper portion of the piezoelectric element 140 and may be linked to the vibrating member 130 so as to be vibrated. The weighting body 150 may serve to amplify vibration of the vibrating member 130 vibrated due to the deformations of the piezoelectric element 140. To this end, the weighting body 150 may be formed of a material having relatively great specific gravity, for example, tungsten (W).

Meanwhile, the weighting body 150 may be installed on the top surface of the piezoelectric element 140 by an adhering member 152. However, the weighting body 150 is not limited as being installed on the top surface of the piezoelectric element 140 by the adhering member 152. For example, the weighting body 150 may also be installed on the vibrating member 130 and may be connected to the vibrating member 130 by a separate installing member.

In addition, the vibrator 100 may further include a plurality of damper members 170. The damper members 170 may serve to prevent collisions amongst the vibrating member 130, the weighting body 150, and the housing 110 at the time of the vibrations of the vibrating member 130 and the weighting body 150, and may be installed on at least one of the vibrating member 130, the weighting body 150, and the housing 110.

In addition, in order to prevent damage and noise occurring due to the collisions, the damper member 170 may be formed of a material having elasticity, for example, a rubber or a synthetic resin.

As described above, the piezoelectric element 140 may be installed on the vibrating member 130 so as to be disposed inwardly of the space forming parts 160, such that the filler A, for example, the adhesive, may be filled into the space formed between both side surfaces of the piezoelectric element 140 and the inner surface of the space forming part 160.

Therefore, even in the case in which damage, for example, cracks, occurs in the piezoelectric element 140, an expansion of the damage may be alleviated. A detailed description thereof will be provided.

Figure 3:
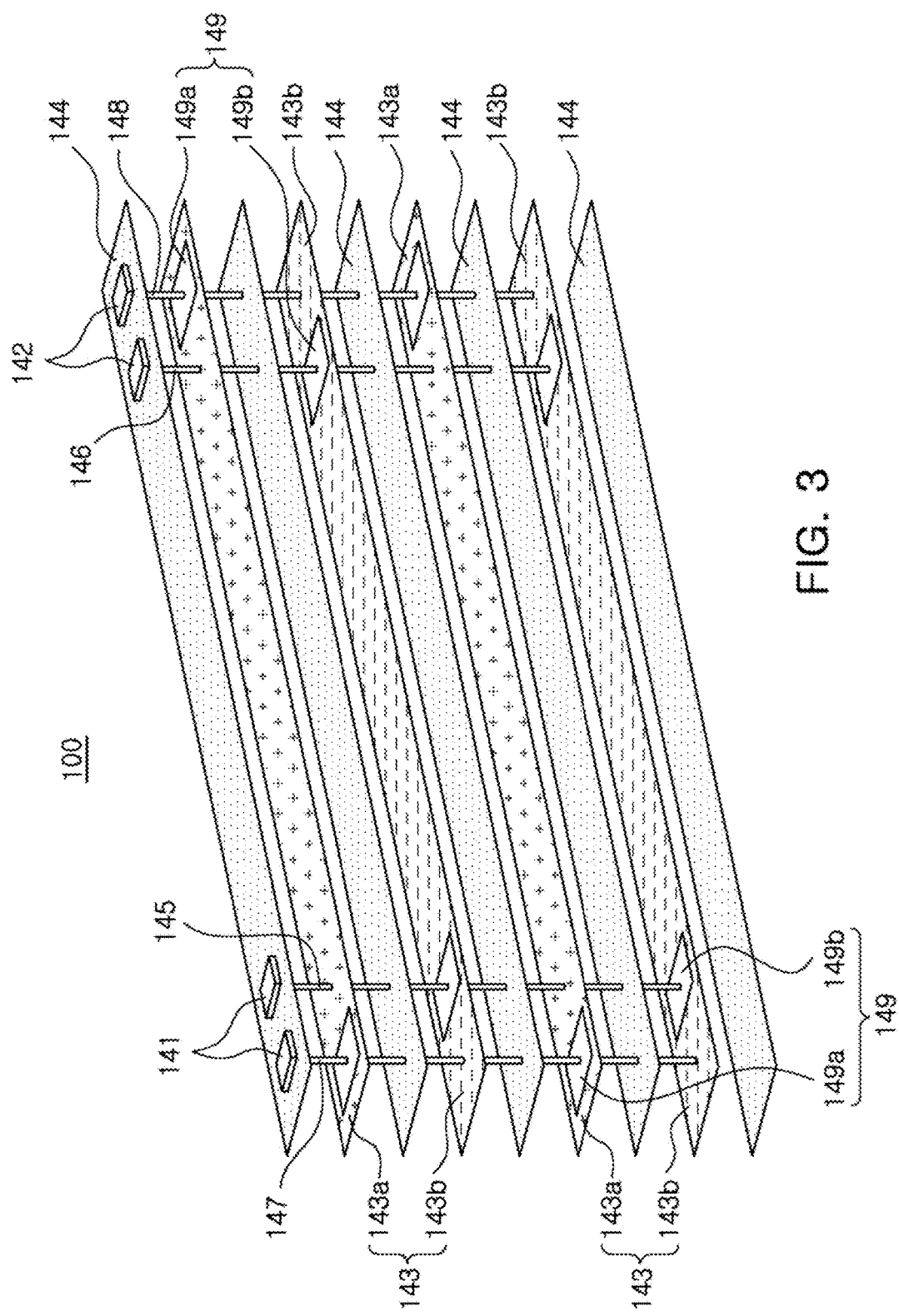
FIG. 3 is an exploded perspective view illustrating a piezoelectric element included in a vibrator according to an exemplary embodiment in the present disclosure.

FIG. 3 is a schematic exploded perspective view illustrating a piezoelectric element included in a vibrator according to an exemplary embodiment in the present disclosure.

Referring to FIG. 3, the piezoelectric element 140 may include the main electrode 141 and at least one preliminary electrode 142 as described above.

In addition, the piezoelectric element 140 may include an electrode layer 143 in which a positive electrode layer 143*a* and a negative electrode layer 143*b* are vertically stacked to alternate with each other repeatedly, and an element part layer 144 interposed between the positive electrode layer 143*a* and the negative electrode layer 143*b*.

In addition, the piezoelectric element 140 may include a main positive electrode connecting member 145 connected to one end of the positive electrode layer 143*a*, a preliminary positive electrode connecting member 146 connected to the other end of the positive electrode layer 143*a*, a main negative electrode connecting member 147 connected, to one end of the negative electrode layer 143*b*, and a preliminary negative electrode connecting member 148 connected to the other end of the negative electrode layer 143*b*.

Meanwhile, the above-mentioned main electrode 141 may be connected to the main positive electrode connecting member 145 and the main negative electrode connecting member 147, and the preliminary electrode 142 may be connected to the preliminary positive electrode connecting member 146 and the preliminary negative electrode connecting member 148.

In addition, the main positive electrode connecting member 145, the preliminary positive electrode connecting member 146, the main negative electrode connecting member 147, and the preliminary negative electrode connecting member 148 may include a via-hole.

In addition, the positive electrode layer 143*a*, the negative electrode layer 143*b*, the main positive electrode connecting member 145, the preliminary positive electrode connecting member 146, the main negative electrode connecting member 147, and the preliminary negative electrode connecting member 148 may be formed of a conductive metal material. However, the type of material forming the positive electrode layer 143*a*, the negative electrode layer 143*b*, the main positive electrode connecting member 145, the preliminary positive electrode connecting member 146, the main negative electrode connecting member 147, and the preliminary negative electrode connecting member 148 is not limited to such a metal material. For example, any material may be readily used as long as it is a conductive material. Further, the element part layer 144 may be formed of a piezoelectric material, for example, a lead zirconate titanate (PZT) ceramic material.

Meanwhile, the electrode layer 143 may further include a dummy layer 149 for electrically separating the positive electrode layer 143*a* and the negative electrode layer 143*b* from one another. That is, negative electrode dummy patterns 149*a* which are separated from the positive electrode layer 143*a* may be disposed on both end portions of the positive electrode layer 143*a*, and positive electrode dummy patterns 149*b* which are separated from the negative electrode layer 143*b* may be disposed on both end portions of the negative electrode layer 143*b*.

That is, both end portions of the positive electrode layer 143*a* may be provided with the negative electrode dummy patterns 149*a* through which the main negative electrode connecting member 147 and the preliminary negative electrode connecting member 148 pass, in order to connect the negative electrode layers 143*b* to one another. In addition, both end portions of the negative electrode layer 143*b* may be provided with positive electrode dummy patterns 149*b* through which the main positive electrode connecting member 145 and the preliminary positive electrode connecting member 146 pass, in order to connect the positive electrode layers 143*a* to one another.

As such, the main electrodes 141 may be connected to the positive electrode layer 143*a* and the negative electrode layer 143*b*, and the preliminary electrodes 142 maybe connected to the positive electrode layer 143*a* and the negative electrode layer 143*b*.

Consequently, even in the case in which power is supplied to only one of the main electrode 141 and the preliminary electrode 142, the power may be supplied to the positive electrode layer 143*a* and the negative electrode layer 143*b* of the piezoelectric element 140.

Further, since power may be supplied through the main electrode 141 and the preliminary electrode 142 even in a case in which such cracks occur due to an external impact, a reduction of an effective electrode surface may be prevented.

A description thereof will be provided in greater detail. In a case in which the preliminary electrode 142 is, not provided in the piezoelectric element 140, when such cracks occur in the central portion of the piezoelectric element 140, the cracks may occur in the electrode layer 143 as well as the element part layer 144. In this case, the electrode layer 143 may be divided into two portions based on a portion in which the cracks occur.

Therefore, power may be supplied to the electrode layer 143 connected to the main electrode 141; however, the power may not be supplied to the electrode layer 143 which is disposed on the opposite side of the main electrode 141 based on the portion in which the cracks occur. As a result, the effective electrode surface may be reduced, such that an amount of vibrations in the piezoelectric element 140 may be reduced.

However, as described above, since the main electrode 141 and the preliminary electrode 142 are provided in the piezoelectric element 140, power may be supplied to the electrode layer 143 through the main electrode 141 and the preliminary electrode 142. Accordingly, since the power is supplied to both portions of the electrode layer 143 based on the portion in which the cracks occur even in the case in which the cracks occur, the reduction in the effective electrode surface may be prevented, such that the reduction in the amount of vibrations may be prevented.

Hereinafter, effects obtainable through the use of the space forming parts provided in the vibrator according to an exemplary embodiment in the present disclosure will be described in greater detail with reference to the drawings.

Figure 5:
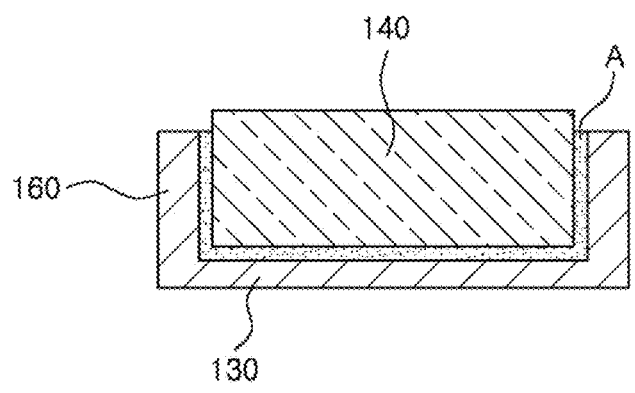
FIG. 5 is a cross-sectional view taken along line B-B' of FIG. 4.

FIG. 4 is a perspective view illustrating a vibrating member and a piezoelectric element included in a vibrator according to an exemplary embodiment in the present disclosure, and FIG. 5 is a cross-sectional view taken along line B-B' of FIG. 4.

Referring to FIGS. 4 and 5, the vibrating member 130 may be provided with the space forming parts 160 disposed to face the side surfaces of the piezoelectric element 140, respectively, and forming a space in which a filler A is provided, together with the side surfaces of the piezoelectric element 140. That is, the space forming parts 160 may be formed as ribs formed to be extended from both side surfaces of the vibrating member 130. In addition, in the case in which the piezoelectric element 140 is installed on the top surface of the vibrating member 130, both side surfaces of the piezoelectric element 140 and the inner surfaces of the space forming parts 160 formed as the ribs may be disposed to be spaced apart from one another at predetermined intervals, respectively, to thereby form the space in which the filler A, that is, the adhesive is, provided.

Therefore, as illustrated in FIG. 5, the filler A may be applied onto the bottom surface of the piezoelectric element 140 and both side surfaces of the piezoelectric element 140.

As such, the filler A, that is, the adhesive, may be applied onto the bottom surface of the piezoelectric element 140 and both side surfaces of the piezoelectric element 140 so as to allow the piezoelectric element 140 to be bonded onto the top surface of the vibrating member 130 and the inner surfaces of the space forming parts 160.

Meanwhile, as, described above, since the piezoelectric element 140 includes the main electrode 141 and the preliminary electrode 142, power may be supplied to the piezoelectric element 140 through the main electrode 141 and the preliminary electrode 142 even in the case in which cracks occur due to an external impact, thereby preventing a reduction of an effective electrode surface.

However, in the case in which the space forming parts 160 are not formed in the piezoelectric element 140, only the bottom surface of the piezoelectric element 140 may be bonded to the top surface of the vibrating member 130 by the adhesive. In this case, cracks may occur. In the case in which power is supplied through the main electrode 141 and the preliminary electrode 142, such cracks may not be widened in, a lower portion of the piezoelectric element 140 which is bonded by the adhesive, but a gap due to the cracks may be gradually increased in an upper portion of the piezoelectric element 140 onto which the adhesive is not applied. In other words, damage due to the cracks may be expanded throughout the piezoelectric element 140.

Consequently, an amount of deformations in the piezoelectric element 140 may be reduced, thereby reducing an amount of vibrations thereof.

However, by providing the filler A, that is, the adhesive, between both side surfaces of the piezoelectric element 140 and the inner surfaces of the space forming parts 160, a phenomenon in which the gap is increased by the cracks in the upper portion of the piezoelectric element 140 may be prevented through the use of the space forming parts 160.

As a result, the reduction in the amount of vibrations thereof may be avoided by preventing the expansion of damage to the piezoelectric element 140 through the use of the space forming parts 160.

As described above, in the vibrator 100, the reduction in the amount of vibrations in the piezoelectric element 140 maybe prevented by using the piezoelectric element 140 including the main electrode 141 and the preliminary electrode 142 even in the case in which the cracks due to the external impact occur.

Further, even in the case in which such cracks occur, the filler A may be provided into the space formed between the inner surfaces of the space forming parts 160 and both side surfaces of the piezoelectric element 140, such that the phenomenon of the gap being increased due to the cracks occurring in the piezoelectric element 140 may be prevented, thereby preventing the reduction in the amount of vibrations.

Hereinafter, a modified exemplary embodiment of the vibrating member will be described with reference to the drawings.

FIG. 6 is a perspective view illustrating a modified exemplary embodiment of a vibrating member.

Referring to FIG. 6, a vibrating member 230 may have a plate like shape, and may be provided with space forming parts 260 which are disposed to face the side surfaces of the piezoelectric element 140, respectively and form a space in which the filler A is provided as illustrated in FIG. 4, together with the side surfaces of the piezoelectric element 140.

In addition, the space forming parts 260 may be formed to be extended from both side surfaces of the vibrating member 230 in the thickness direction thereof. That is, the space forming parts 260 may be formed as ribs formed to be extended from both side surfaces of the vibrating member 230.

Meanwhile, the space forming parts 260 may be provided with a guide protrusion 262 for guiding an installation position of the piezoelectric element 140. The guide protrusion 262 may include a plurality of guide protrusions and may be formed to protrude inwardly from the inner surfaces of the space forming part 260. Further, the plurality of guide protrusions 262 may be disposed to be spaced apart from one another at predetermined intervals in the lengthwise direction of the piezoelectric element 140.

The guide protrusions 262 may serve to guide the installing position of the piezoelectric element 140 so that an interval from one side surface of the piezoelectric element 140 to the inner surface of the space forming part 260 disposed to face one side surface of the piezoelectric element 140 is equal to an interval from the other side surface of the piezoelectric element 140 to the inner surface of the space forming part 260 disposed to face the other side surface of the piezoelectric element 140 at the time of the installation of the piezoelectric element 140.

Accordingly, an installation of the piezoelectric element 140 on the vibrating member 230 while being eccentric to only one of the inner surfaces of the space forming parts 260 formed on both side surfaces of the vibrating member 230, respectively, may be prevented.

As a result, an issue of the filler A being unable to be provided due to a relatively narrow space between one side surface of the piezoelectric element 140 and the inner surface of the space forming part 260 disposed to face one side surface of the piezoelectric element 140 since the piezoelectric element 140 is installed to be eccentric to one side of the vibrating member 230 may be prevented.

As such, a gap on the piezoelectric element 140 being widened due to cracks occurring thereon may be prevented by allowing an appropriate amount of filler A to be provided onto both side surfaces of the piezoelectric elements 140 by using the guide protrusions 262.

As set forth above, according to exemplary embodiments in the present disclosure, since the expansion of damage to the piezoelectric element may be prevented, the reduction in the amount of vibrations therein may be suppressed.

While exemplary embodiments have been shown and described above, it will be apparent to those skilled in the art that modifications and variations could be made without departing from the scope of the present invention as defined by the appended claims.

What is claimed is:

1. A vibrator comprising:
   a vibrating member installed within a housing;
   a piezoelectric element installed on the vibrating member; and
   space forming parts disposed to face side surfaces of the piezoelectric element, respectively, and forming a space in which a filler is provided, together with the side surfaces of the piezoelectric element,
   wherein the piezoelectric element includes:
   a main electrode formed by an electrode pair; and
   at least one preliminary electrode formed by an electrode pair and disposed to be spaced apart from the main electrode.

2. The vibrator of claim 1, wherein the piezoelectric element is deformed even in a case in which only one of the main electrode and the preliminary electrode is connected to an external power source.

3. The vibrator of claim 1, wherein the piezoelectric element is fixedly installed on the vibrating member using an adhesive and the filler is the adhesive.

4. The vibrator of claim 1, wherein the space forming part has a height equal to half or more of a thickness of the piezoelectric element.

5. The vibrator of claim 1, wherein the space forming part is provided with a guide protrusion for guiding an installation position of the piezoelectric element.

6. The vibrator of claim 5, wherein the guide protrusion includes a plurality of guide protrusions and the plurality of guide protrusions are disposed to be spaced apart from one another at predetermined intervals in a lengthwise direction of the piezoelectric element.

7. The vibrator of claim 1, wherein the space forming parts are formed as ribs formed to be extended from both side surfaces of the vibrating member.

8. The vibrator of claim 7, wherein the space forming part has a length corresponding to that of the piezoelectric element in a central portion of the vibrating member.

9. The vibrator of claim 1, wherein the piezoelectric element includes:
   an element part layer;
   an electrode layer including a positive electrode layer and a negative electrode layer which are repeatedly vertically stacked on the element part layer to alternate with each other;
   a main positive electrode connecting member connecting the positive electrode layers to one another;
   a main negative electrode connecting member connecting the negative electrode layers to one another;
   at least one preliminary positive electrode connecting, member connecting the positive electrode layers to one another and disposed to be spaced apart from the main positive electrode connecting member; and
   at least one preliminary negative electrode connecting member connecting the negative electrode layers to one another and disposed to be spaced apart from the main negative electrode connecting member.

10. The vibrator of claim 9, wherein the electrode layer further includes a dummy layer for electrically separating the positive electrode layer and the negative electrode layer from one another.

11. The vibrator of claim 1, further comprising a circuit board connected to the piezoelectric element.

* * * * *